United States Patent

Bunting et al.

[15] 3,641,254

[45] Feb. 8, 1972

[54] MICROCIRCUIT PACKAGE AND METHOD OF MAKING SAME

[72] Inventors: Henry E. Bunting, Folcroft; Paul E. Smith, Bala Cynwyd, both of Pa.

[73] Assignee: W. S. Electronic Services Corporation, Clifton Heights, Pa.

[22] Filed: June 27, 1969

[21] Appl. No.: 837,244

Related U.S. Application Data

[63] Continuation-in-part of Ser. No. 836,489, June 25, 1969, Continuation-in-part of Ser. No. 656,749, July 28, 1967.

[52] U.S. Cl. ..................................174/68.5, 29/590, 29/626, 174/52 PE, 174/DIG. 3, 204/15, 264/272, 317/101 CC, 317/234 E

[51] Int. Cl. ..........................................H05k 1/18, H05k 5/02

[58] Field of Search .........................174/52.5, 52.6, 68.5 FD; 317/101 A, 101 CC, 101 CP; 29/625–627, 588–590; 264/272

[56] References Cited

UNITED STATES PATENTS

| | | | |
|---|---|---|---|
| 3,149,266 | 9/1964 | Lipton | 174/68.5 X |
| 3,262,022 | 7/1966 | Caracciolo | 174/DIG. 3 |

*Primary Examiner*—Darrell L. Clay
*Attorney*—Gerald J. Weiser

[57] ABSTRACT

A microcircuit package formed of a dielectric substrate having a central area for mounting a circuit network device therein, such as a chip or wafer, metallic leads embedded in the substrate, grooves formed in one surface of the substrate providing between them raised portions or lands interconnecting the free ends of the leads with the recess and a conductive material on the lands thereby forming a raised conductive path from the leads to the recess. The invention also includes a method of making the microcircuit package accurately and economically.

27 Claims, 7 Drawing Figures

INVENTORS.
HENRY E. BUNTING
PAUL E. SMITH
BY
McClure, Weiser + Millman
ATTORNEYS.

INVENTORS.
HENRY E. BUNTING
PAUL E. SMITH
BY
McClure, Weiser & Millman
ATTORNEYS.

INVENTORS.
HENRY E. BUNTING
PAUL E. SMITH
BY
ATTORNEY.

MICROCIRCUIT PACKAGE AND METHOD OF MAKING SAME

This invention relates to a microcircuit package and method of making the same and is a continuation-in-part of copending application Ser. No. 836,489, filed June 25, 1969 entitled "Plastic Microcircuit Package and Method of Making Same" which is in turn a continuation-in-part of application Ser. No. 656,749 filed July 28, 1967 entitled "Method and Means for Making Flash Free Molded Plastic Electronic and Electrical Components."

Heretofore, a dielectric substrate with circuitry associated therewith was made by forming grooves through one surface thereof defining the circuit path, covering the entire surface including the grooves with a conductive material and abrading or otherwise treating the conductive material to remove it from the nongroove or land surfaces thereby leaving a conductive path in the grooves. This method possesses several disadvantages. While it may suffice for printed circuits, forming a conductive path in grooves does not provide the high degree of resolution required for microcircuitry. Additionally, laying the conductive material over the entire substrate surface and then removing it from the land areas is most wasteful.

It is the primary object of this invention to provide a method of making a microcircuit package which avoids the aforesaid disadvantages.

Another object of the invention is to provide a microcircuit package in which the leads are embedded, flash free, in the dielectric substrate, the inner ends of which leads are connected by a conductive raised path to the central recess which is adapted to mount a network device.

Another object of the invention is to provide a microcircuit package of the character described in which two independent circuit paths are included in the substrate, one on the raised portions or land areas from one set of leads to the recess and the other in adjacent grooves from another set of leads to the recess area.

Another object of the invention is to provide a method and means of molding a plastic substrate so as to embed therein, flash free, the leads of a frame with the inner ends of the leads extending through the upper surface of the substrate and land areas or raised portions in a desired path between the inner ends of the leads and the central recess for mounting a network device, the remaining upper surface of the substrate between the land areas being grooved or at a lower level whereby the application of conductive material on the land areas provides a raised rather than a grooved conductive path from the leads to the network device-mounting recess.

These and other objects and features of the invention will become more apparent as the following description proceeds in conjunction with the accompanying drawings, wherein.

Figure 1:
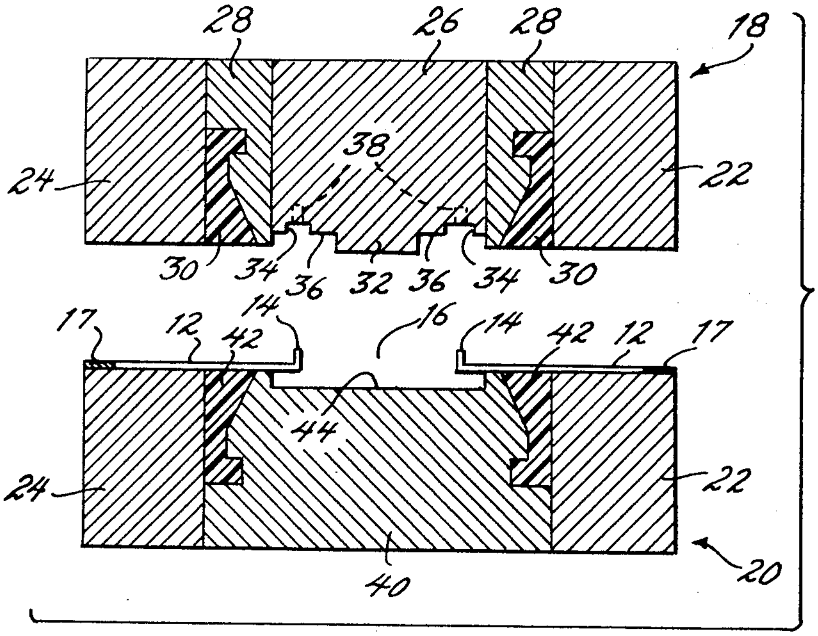
FIG. 1 is a group view in vertical section of upper and lower mold sections used to make the instant microcircuit packages.

Specific reference will now be made to the drawings in which similar reference characters are used for corresponding elements throughout. The invention concerns a microcircuit package comprised of a dielectric substrate molded or otherwise formed to provide a central recess opening through one surface in which a microcircuit network device is to be mounted and in which substrate leads are embedded, flash free, the inner ends of which leads are connected by raised conductive paths to the recess for ultimate operative connection to the microcircuit network device.

Figure 3:
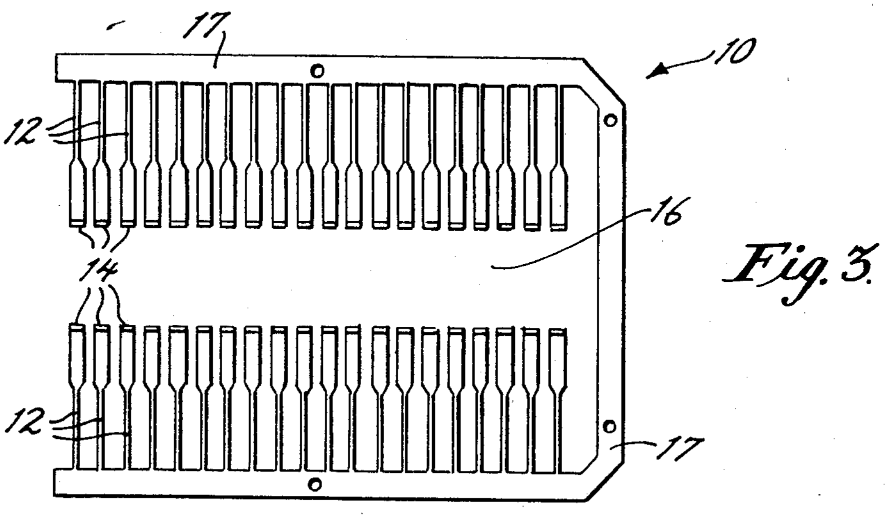
FIG. 3 is a face view of a typical lead frame used in the instant invention.

One type of lead frame 10 is shown in FIG. 3 and consists generally of a plurality of oppositely extending leads 12 whose inner ends 14 are spaced from each other to provide an inner free area 16. The outer ends of the leads are connected by a supporting frame 17 which is ultimately severed and discarded. The leads and frame are very thin and made of a wide variety of conductive metals or their alloys such, for example as Kovar, a Ni-Fe-Co alloy.

Coming now to FIG. 1 which illustrates pertinent portions of a molding machine with upper and lower units 18 and 20, each of which includes a conventional steel blocks 22 and 24 which nestingly engage and support between them insert units which make up the mold elements, the blocks being retained by suitable bolts (not shown) associated with casing walls or support bars (not shown).

The upper mold 26 is a steel block which is retained between steel inserts 28 which carry plastic lead flash sealers 30. These sealers are preferably made of Teflon, DuPont's trademark for polytetrafluoroethylene alone or copolymerized with hexafluoropropylene which is nonadhesive to metals and has a low-frictional coefficient. Any other plastic may also be employed which contains these properties.

The upper or female mold 26 is formed to contain a central protrusion or male member 32 of any desired shape to conform to the recess in which the microcircuit device will ultimately be mounted. The undersurface of the mold 26 will also be provided with grooves 34 that can be formed therein by chemical milling, hobbing or any other suitable means. Thus on both sides of the grooves, the mold 26 contains outwardly spaced portions 36. The grooves are configurated in a desired path and spaced apertures 38 are provided therein which open through their bases for a purpose soon to appear. These apertures are generally about 0.015 to 0.030 deep as compared to the grooves 34 which are generally about 0.007 deep.

The lower or male mold 40 is also a steel block which is nestingly contained between the retainer blocks 22 and 24 and which in turn nestingly mounts Teflon lead flash sealers 42 which are complementary to the sealers 30 of the upper mold. The mold 40 is provided centrally with a cavity 44 which is coextensive with the upper mold 26.

In use, the inner ends 14 of the leads are bent upwardly and the frame 10 is then layed upon the lower mold as shown in FIG. 1 so that the supporting frame 17 and a portion of the leads thereof rest on the metallic blocks while the remaining portions of the leads 12 rest on the teflon inserts 42 with the inner end portions of the leads extending towards each other inwardly of the marginal edge of the cavity 44. THe upper unit 18 is then closed down upon the lower unit 20 at which time the upturned inner ends 14 of the frames enter the apertures 38 which are spaced to conform to the spacing of the inner ends 14 of the leads. The protrusion 32 enters the cavity 44 which is considerably larger than the protrusion. The size of the cavity 44 exceeds that of the space 16 between the leads of the frame 10.

Figures 2, 6:
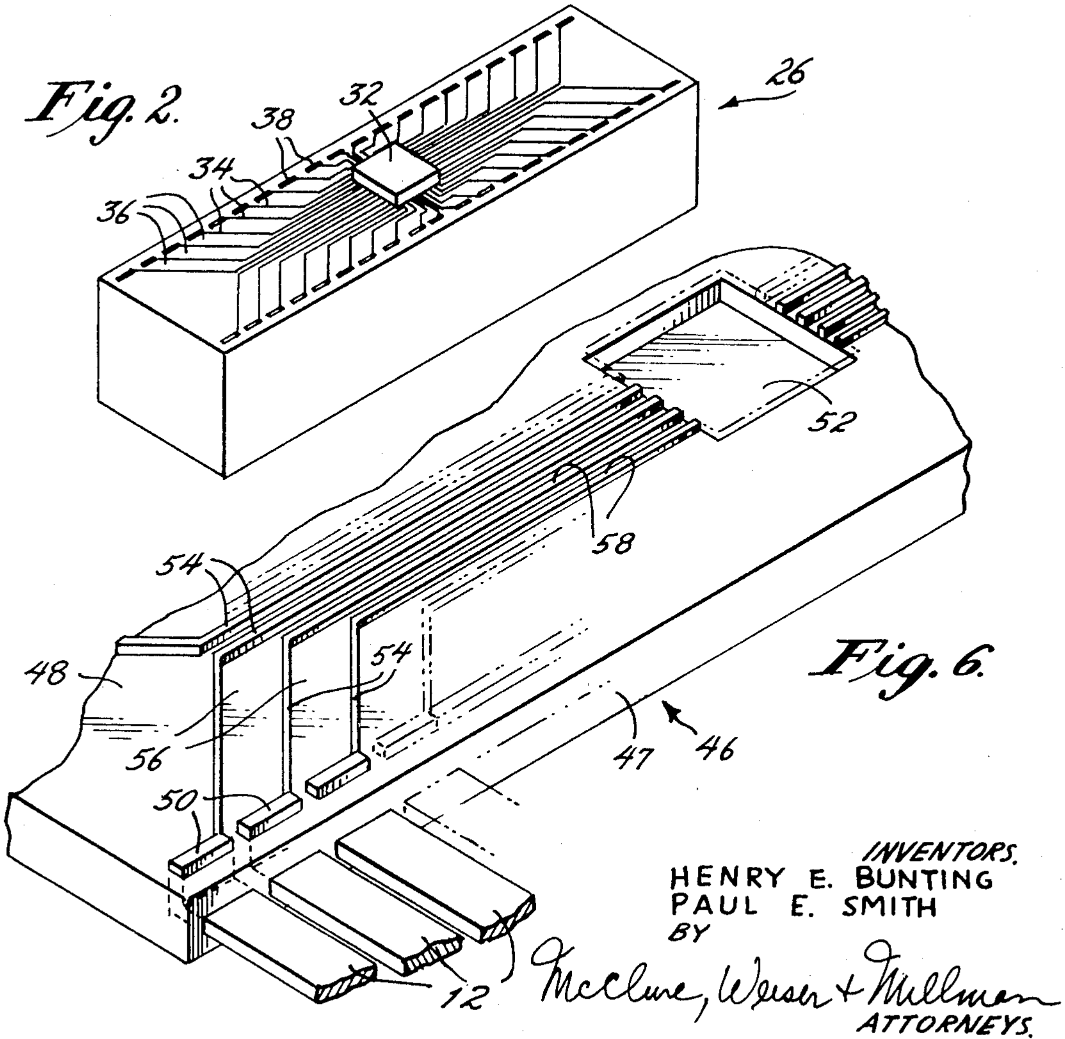
FIG. 2 is a perspective view of a typical upper mold insert.
FIG. 6 is a fragmentary perspective view of the molded package prior to metallizing the same.

A suitable resin is then fed into the cavity 44 and there transfer molded at temperatures of about 300°–365° F. and pressures of about 400 p.s.i. using thermosetting resins such as silicone, epoxy and phenolic resins and the like. See "Textbook of Polymer Science," by Fred W. Billmeyer, Jr., Interscience Publishers, a division of John Wiley and Sons, New York 1962, particularly chapters 19 and 20, which is herein incorporated by reference. As a result of this transfer molding a plastic body 46 is formed through whose longitudinal sides 47 the leads extend and are embedded, flash free, and the inner ends 14 of which leads extend through the upper surface 48 thereof, as at 50 as seen in FIG. 6. In the upper surface 48 there is also formed a recess 52 (equivalent to protrusion 32 of the upper mold), raised or land portions 54 (equivalent to the grooves 34 of the upper mold 26 connecting the inner embedded ends of the leads with the recess and grooves 56 between the lands (equivalent to the portions 35 of the upper mold). Thus the upper surface 48 of the plastic body shown in FIG. 6 is the inverted form of the under surface of the mold 26 as seen in FIG. 2

The entire molded member 46 is baked preferably at 300°–400° F. for about 2 hours. It is then dipped in a conventional plating resist, such for example as viscosity adjusted polyvinyl chloride, which deposits a thin coating over the lands 54 and the grooves 56 therebetween. The member is then ground which removes the resist from the lands only and also roughens its surface rendering it more receptive to conductive materials.

The upper surface 48 of the member 46 is then metallized by subjecting it to conventional metallization, such as electroless plating, vacuum deposition, or other known methods. To further insure wetability of the surface the same may be treated with an acid preparation, such as dilute sulfuric acid, prior to nickel plating.

The plating resist is then stripped from the member 45 preferably with a suitable solvent, such as methylene chloride if polyvinyl chloride is the resist used.

The final product, after removal of the supporting frame 16, is a microcircuit package in which leads extend through and are embedded in the sides, flash free, of the plastic dielectric substrate whose inner or embedded ends are connected by raised conductive paths to the central recess in which a microcircuit device will ultimately be mounted and bonded, ultrasonically or otherwise, to the conductive paths. Gold plating may be added to assist in the bonding of the device to the conductive paths.

Figure 4:
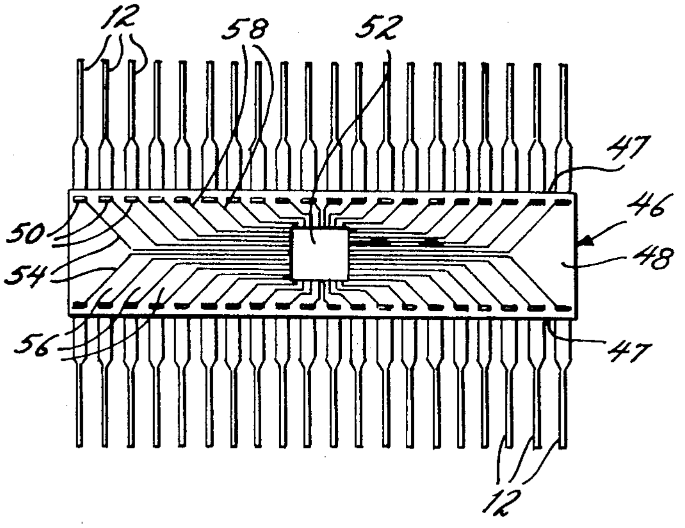
FIG. 4 is a plan view of one type of package of the instant invention.
Figure 5:
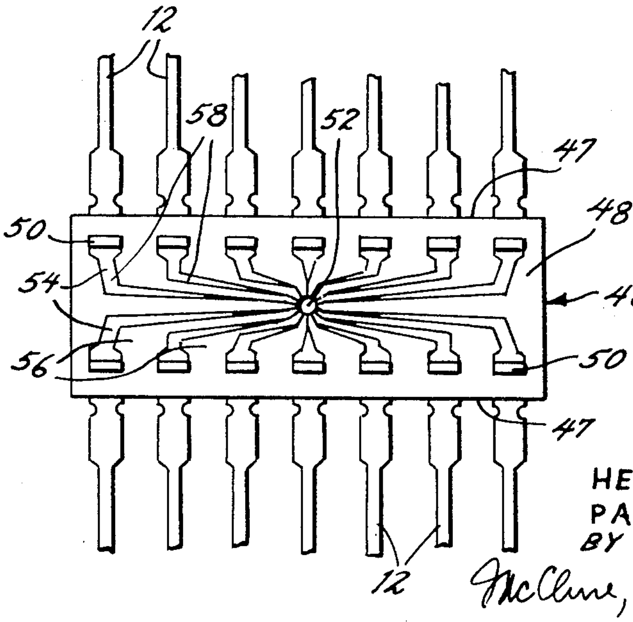
FIG. 5 is a view similar to FIG. 3 of another type of package.

Thus, as seen, for example, in the device of FIG. 4, the raised conductive paths (on the lands of the grooves) are shown at 58 and interconnect the recess 52 with the inner ends of the leads as they are exposed at the surface as at 50, the remaining areas of the upper surface of the plastic member being at a lower level or grooved as at 56. This package is known in the trade as a 40 lead dual-in-line flat pack. The package shown in FIG. 5 is known as a 14 lead dual-in-line flat pack and differs from that shown in FIG. 4 only with respect to the number of leads, their width, the configuration of the conductive path 58 and the central recess or pad area 52. The 14 lead package shown in FIG. 5 is so designed that the leads converge on a circle of 0.030 inch diameter with 0.003-wide leads separated by 0.003 inch lands. This package and many similar types (where the configuration may not be a circle, but rather a square, rectangle, or other shape for matching conductive beams or bumps or semiconductor chips) are designed explicitly to mount particular types of flip-chips and beam-lead semiconductors. The resolution required for this package is readily attained by the instant invention. The principles of the invention are, of course, applicable to all sizes and shapes of packages.

Figure 7:
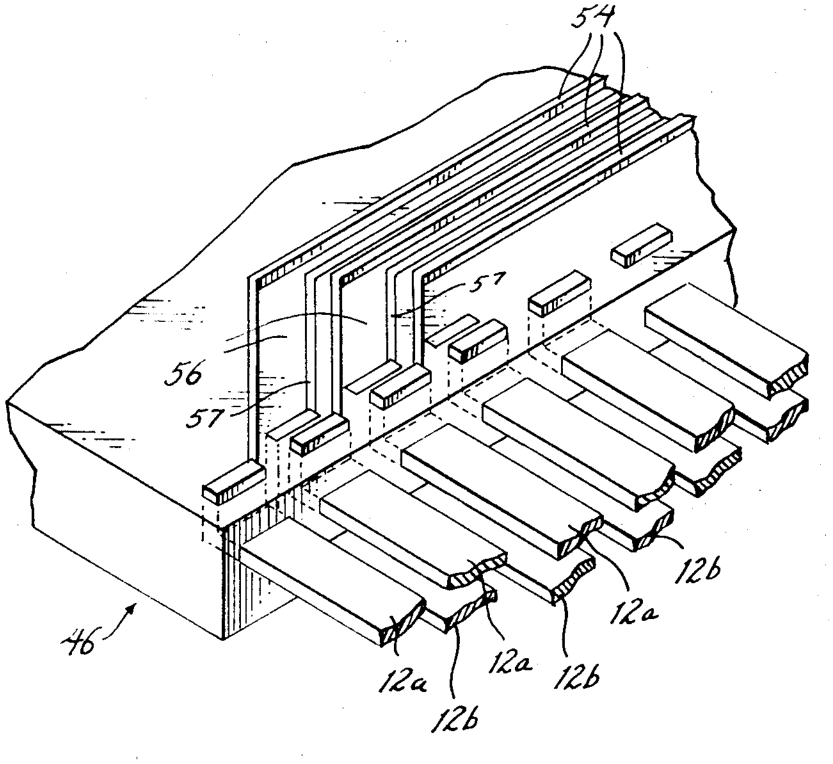
FIG. 7 is a fragmentary view of the molded package after metallizing in the grooves.

A variant of the package is one which contains two separate conductive paths, one on the lands as herein before described, and one on the bottom of the grooves 56. Thus, as shown in FIG. 7, the plastic body 46 can be molded to contain two sets of vertically spaced leads **12*a* and 12*b*, one terminating at the lands 54 and the other at the bottom of the grooves 56. After the lands are nickel plated as described above and the resist removed, a free flowing conductive adhesive, such as silver-filled epoxy, can be applied to the bottom of the grooves which forms additional conductive paths 57** interconnecting the other set of leads with the recess in which the microcircuit network device will ultimately be mounted.

The principles of the invention are also applicable to dielectric substrates made of ceramics. In that case, ceramics are laminated to embed the inner end portions of the metallic leads and grooves are provided in one surface of the substrate by compaction to provide raised or land areas between the grooves. Thereafter, a resist is deposited on the surface, which is then ground to remove the resist from the lands, metallized to deposit a coat of conductive material on the lands, and finally the resist is removed. It will be understood that the ceramic package can also be made by brazing leads directly to the conductive path on the lands at the top of the substrate.

It should be understood that both thermoplastic and thermosetting resins may be employed in the instant invention. Thus the thermoplastics can be injection molded at about 400–20,000 p.s.i. to form the body 46 which embeds the leads and includes the lands 54. Nonlimitative examples of such thermoplastic resins are polystyrene, polyethylene, polypropylene, polyamides such as nylon, polysulfonamides, etc. See "Textbook of Polymer Science" by Fred W. Billmeyer, Jr., supra page 7.

Additionally, while the area 52 has been shown and described as a recess into which a microcircuit containing device is mounted and then electrically connected to the conductive path, it is within the purview of the invention that the area 52 can terminate flush with the lands 54 for the mounting of microcircuit-containing devices in certain special applications, in which case the central protrusion 32 of the upper mold member 26 will be eliminated and the bottom of the mold member 26 will be slush with the portions 36 thereof.

While preferred embodiments have here been shown and described, it will be understood that skilled artisans may make minor variations without departing from the spirit of the invention.

What is claimed is:

1. A microcircuit package comprising a dielectric substrate including at least a pair of opposite sides and a surface joining the sides, metal leads embedded in the substrate extending through said opposite sides and including inner end portions exposed through said surface, a recess in said surface adapted to mount a microcircuit-containing device, grooves in said surface providing lands or raised paths therebetween extending from said inner ends of said leads to said recess, and conductive material on said raised paths.

2. The package of claim 1 wherein said dielectric substrate is plastic.

3. The package of claim 2 wherein said plastic is a silicone, epoxy or phenolic thermosetting resin.

4. The package of claim 1 wherein said dielectric substrate is ceramic.

5. The package of claim 1 and a microcircuit-containing device mounted in said recess and electrically connected to said raised conductive paths.

6. The package of claim 1 including a second set of metal leads embedded in said substrate beneath the first-named leads having inner ends located at the bottom of said grooves and further conductive material on the bottoms of the grooves interconnecting said inner ends of said second set of leads with said recess.

7. THe package of claim 6 herein said metal leads of said second set are bent to terminate at said conductive material on the bottoms of said grooves.

8. The package of claim 1 wherein said metal leads are bent to terminate at said conductive material on said raised paths.

9. The package of claim 1 wherein said substrate is a thermoplastic resin.

10. The package of claim 1 wherein said substrate is a thermosetting resin.

11. The package of claim 1 wherein said metal leads are part of a lead frame.

12. The package of claim 1 wherein said metal leads are flat.

13. The package of claim 1 wherein said metal leads are molded into said substrate.

14. The package of claim 1 wherein said conductive material is metal.

15. A method of making a microcircuit package comprising forming a recess substantially centrally of a dielectric substrate which opens through one surface thereof, forming grooves in the surface thereby providing raised paths or lands therebetween terminating at the recess, embedding metal leads in the substrate with its inner ends bent to terminate at the lands, applying a plating resist over the surface, removing the resist from the lands, metallizing the lands to form conductive paths from the inner ends of the leads to the recess and removing the remaining resist from the grooves.

16. The method of claim 15 wherein the forming of the recess and grooves and the embedding of the leads in the substrate is done in a single operation.

17. The method of claim 16 wherein the forming of the substrate is done in the same single operation as the forming of the recess and grooves and the embedding of the leads in the substrate.

18. The method of claim 15 wherein the substrate is made of plastic and the recess and grooves are formed and the leads are embedded in the substrate by transfer molding.

19. The method of claim 13 wherein the plastic is a silicone epoxy or phenolic thermosetting resin.

20. The method of claim 18 wherein a first mold unit is provided having a cavity, laying a metal lead frame on the first mold unit so that the inner ends of the leads extend inwardly beyond the edge of the cavity and are upturned, providing a second mold having grooves and apertures opening therein and a central protuberance, closing the molds so that the upturned inner ends of the leads are received in the apertures and the protuberance extends into the cavity and transfer molding the plastic in the cavity to form the substrate with the central recess, grooves and embedded leads before the plating resist is laid thereon.

21. The method of claim 15 and curing the metallized is substrate before finally removing the resist from the grooves thereof.

22. The method of claim 15 wherein the resist is removed from the lands by grinding and the metallizing is effected by electroless nickel plating.

23. The method of claim 15 and the steps of embedding a second set of leads in the substrate beneath the first named leads before applying the plating resist and applying a conductive layer on the bottoms of the grooves to conductively connect the inner ends of the second set of leads with the recess.

24. The of claim 15 wherein the substrate comprises ceramics laminated to embed the leads and the recess and grooves are formed therein by compaction.

25. A microcircuit package comprising a dielectric substrate including at least a pair of opposite sides and a surface joining the sides, metal leads embedded in the substrate extending through said opposite sides and including inner end portions exposed through said surface, an area of said surface substantially centrally of said substrate adapted to mount a microcircuit-containing device, grooves in said surface providing lands or raised paths therebetween extending from said inner ends of said leads to said area, and conductive material on said raised paths.

26. The package of claim 14 wherein said metal includes gold.

27. The package of claim 6 and a microcircuit-containing device mounted in said recess and electrically connected to said raised conductive paths and to said conductive material on the bottoms of said grooves.

* * * * *